United States Patent [19]

Ambrose

[11] Patent Number: 5,042,971
[45] Date of Patent: Aug. 27, 1991

[54] METHOD OF MANUFACTURING AN ELECTRICAL CIRCUIT SYSTEM AND ELECTRICAL CIRCUIT SYSTEM

[76] Inventor: Stephen D. Ambrose, Ste. 176, 33338 Agua Dulce Canyon Rd., Agua Dulce, Calif. 91350

[21] Appl. No.: 510,465

[22] Filed: Apr. 16, 1990

[51] Int. Cl.⁵ .................. H01R 9/07; H01R 9/09
[52] U.S. Cl. ..................... 439/77; 361/398; 439/516; 439/912
[58] Field of Search ............ 439/67, 68, 77, 493, 439/70, 71, 516, 912; 361/398, 400, 401, 407, 408

[56] References Cited

U.S. PATENT DOCUMENTS

| | | | |
|---|---|---|---|
| 3,001,171 | 9/1961 | Schultz | 439/49 |
| 3,325,580 | 6/1967 | Barcus | 84/1.16 |
| 3,408,612 | 10/1968 | Bute | 439/893 |
| 3,544,950 | 12/1970 | Lopez | 361/401 |
| 3,772,775 | 11/1973 | Bonnke | 439/493 |
| 3,772,776 | 11/1973 | Weisenburger | 439/77 |
| 3,873,889 | 3/1975 | Leyba | 361/398 |
| 4,018,491 | 4/1977 | Niedzwiecke . | |
| 4,044,397 | 8/1977 | Moore | 439/55 |
| 4,474,420 | 10/1984 | Nestor | 439/498 |
| 4,609,241 | 9/1986 | Peterson | 439/85 |
| 4,658,104 | 4/1987 | Koizumi | 439/77 |
| 4,761,881 | 8/1988 | Bora | 361/400 |
| 4,785,704 | 11/1988 | Fishman | 84/1.16 |

OTHER PUBLICATIONS

Electronics Magazine, "Packaging" Article, p. 112, 10-1988.
IBM Bulletin, Roche, vol. 6, No. 8, p. 87, 1-1964.
IBM Bulletin, Dunman, vol. 7, No. 3, p. 182, 8-1964.

*Primary Examiner*—Neil Abrams
*Attorney, Agent, or Firm*—L. Lee Humphries

[57] ABSTRACT

A method of manufacturing an electrical circuit system comprising electrical conductors on a flexible film and an article of manufacture made thereby, which may be used in place of printed circuit boards and which conductors form connector means for readily connecting to the leads of one or more sides of an electronic package. The electrical conductors also form a means for selectably connecting each electrical conductor from each pin to a selected input or output conductor, comprising a first and second plurality of conductors, such as a matrix having a column of conductors and a row of conductors. The electrical circuit system may be manufactured by numerous methods such as applying a conductive ink or paint by screening, photolithography or drawn by a digital plotter on a plastic film, such as Mylar. The film may include electrical edge connection means to provide input or output to or from said conductors. All or most of the system is integral, thus forming the conductors and the in-line connector portion of the conductors in continuum, using the same conductive material, such as ink, or paint and the same dielectric material, such as ink, or paint. A dielectric covers the appropriate portion of the system.

28 Claims, 7 Drawing Sheets

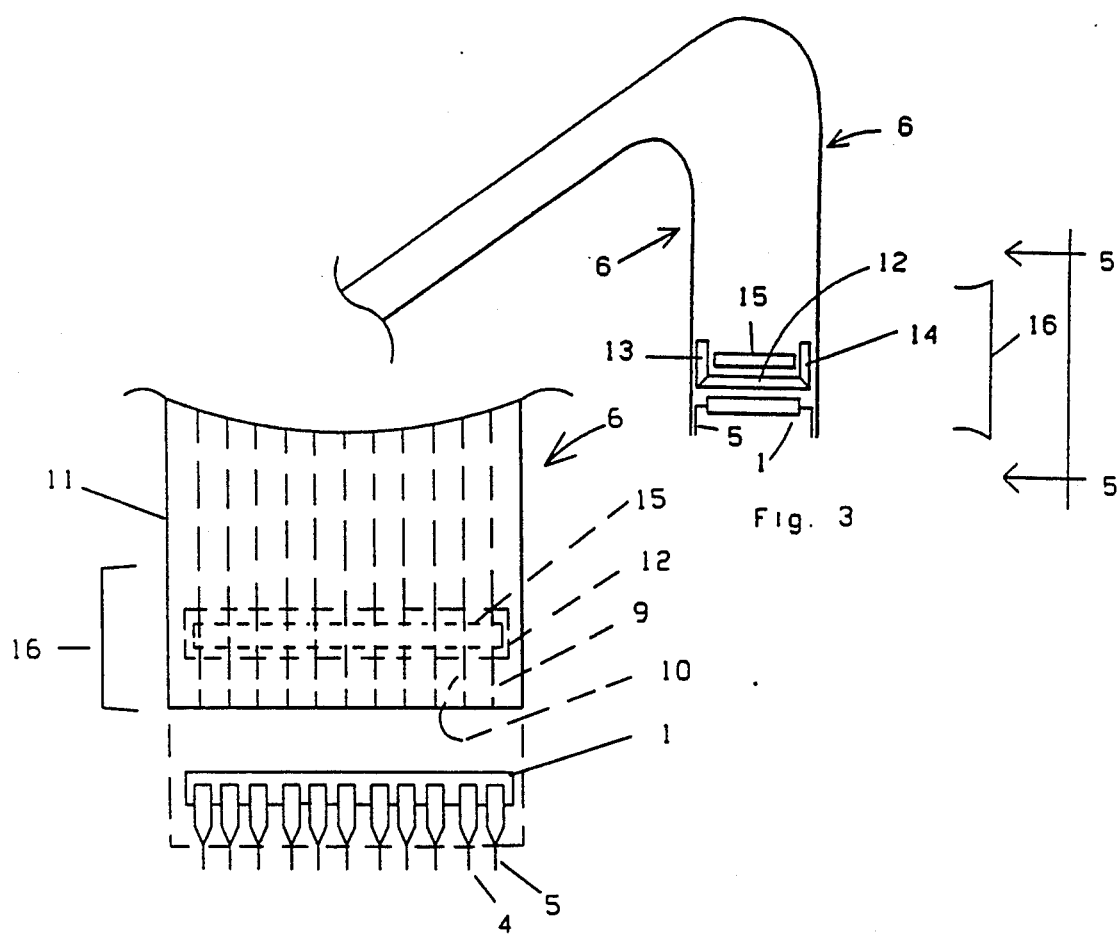
Fig. 3
Fig. 4
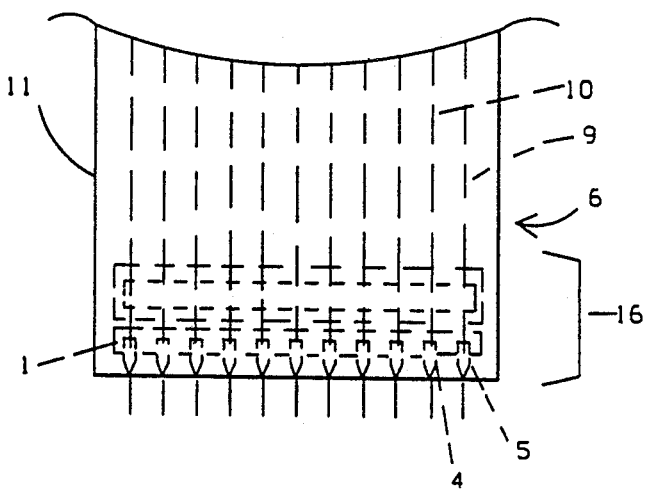
Fig. 5

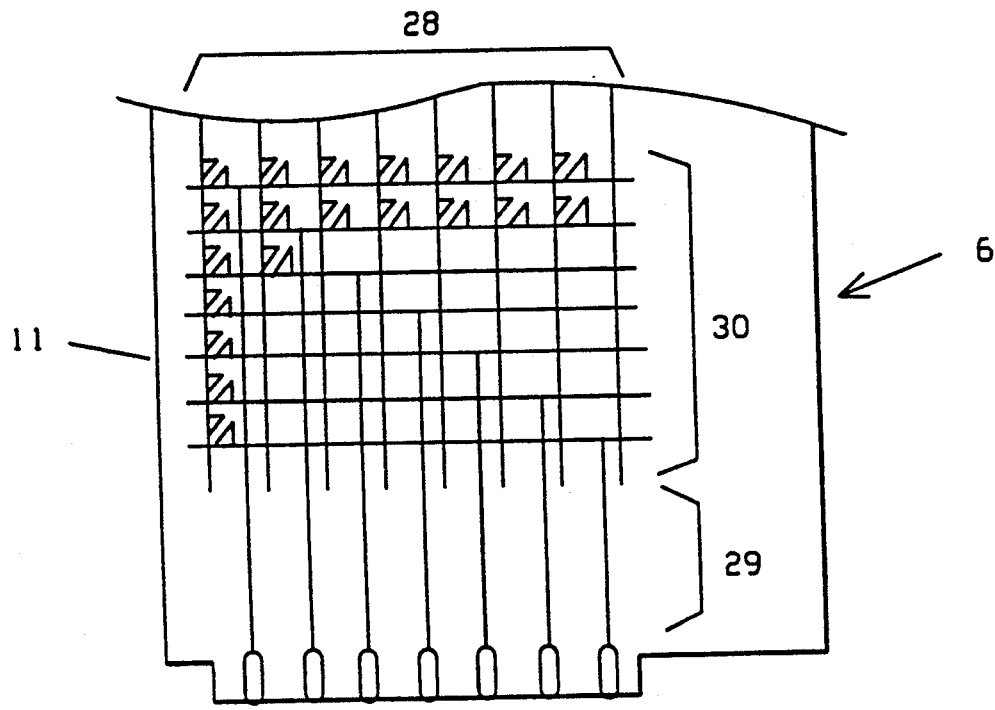
Fig. 7
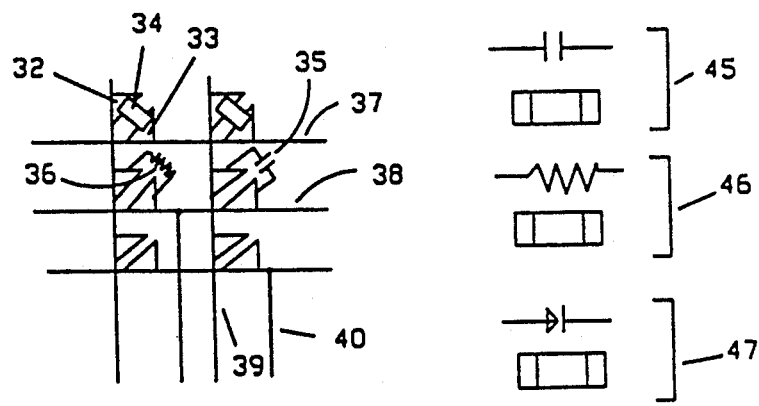
Fig. 8
Fig. 10
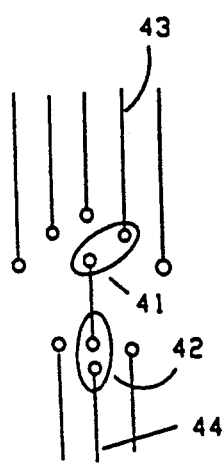
Fig. 9
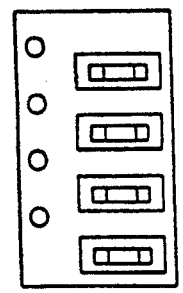
Fig. 11

METHOD OF MANUFACTURING AN ELECTRICAL CIRCUIT SYSTEM AND ELECTRICAL CIRCUIT SYSTEM

BACKGROUND OF THE INVENTION

This invention is related to a patent application filed by me simultaneously herewith, entitled Extension Electrical Switch System and Method of Manufacture, Ser. No. 07/510,196. That patent application relates to an electrical system including one or more touch-type switches.

This invention is a method of manufacture of an electrical circuit system which may be used totally or partially in place of printed circuit boards, conductors, connectors and sockets. This invention includes also the article of manufacture made by such method.

The manufactured electrical circuit system comprises a flexible film having thereon conductors which provide one or more connectors for connecting to in-line packages and other electronic packages. Said conductors and connectors are all similarly created of a conductive material. Selected portions of the conductors are covered with a dielectric to provide insulated areas and so as to leave exposed areas. The flexible film is generally flat or planar.

This system comprises one or more connectors for connecting to the "leads", or "electrical leads", (which are often referred to in the art as "pins"), of one or both sides of one or more in-line packages. It is also adapted to connect to the leads on all four sides of flatpacks, quadpacks and other electronic packages. Such packages are used to house a variety of electronic devices such as analog, linear and digital IC's, LSI's, microprocessors, voltage regulators, resistors, switches, optocouplers, display segments and other electrical components and devices.

The system also comprises electrical conductors running to and from the connector, such as from each pin of a dual in-line package (DIP). Means may also be included for selecting and connecting each conductor to provide a desired electrical input or output to or from each pin of the in-line or other electronic package. The system may be used to connect additional circuitry to dual in-line (DIP) packages, single in-line packages, flat-packs, quadpacks and other electronic packages.

This invention is not only useful in original manufacture but is also useful in providing an economic, uncomplicated, reliable add-on capability. After an electronic device is manufactured, it is often desirable to add additional components or circuitry or to connect to existing components or circuitry. The system of the invention provides a ready capability for doing so.

PRIOR ART

Ribbon cables are used in the prior art, particularly in the computer interconnect art. The ribbon cable is a flat, flexible cable comprised of conductors embedded in a plastic to form the cable. The cable appears to be a series of miniature, parallel conductors whose plastic coatings are joined at their sides. Such ribbon cables are often made into assemblies which include a connector or flat cable plug or the like. Connection between an end connector and the cable is often accomplished by using a press-type connector which has a series of fork-type pins which pierce the cable at each conductor to make contact therewith. In other cases, connection is made to each conductor by soldering or welding each conductor to one end of each pin of the plug or connector.

The prior art sometimes connects to DIP (dual in-line packages) and single in-line packages by inserting the packages in sockets disposed on circuit boards. Another method for mounting electronic packages is a piggyback method which uses a DIP which itself has a socket in its upper surface, into which another DIP can be inserted. The bottom DIP is inserted into a socket disposed on the circuit board, thus connecting both DIPs into the circuit board system. Another method of connecting to a DIP is to insert the pins, or leads, of the DIP through holes in the copper foil on the circuit board and soldering the pins to printed circuit conductors on the opposite side of the circuit board from the DIP.

Such prior art components, including in-line packages, flatpacks, quadpacks and other packages of electric components are found in most electronic parts stores or are available from electronic parts dealers and distributors.

Electrical connectors come in many forms, shapes and structures. It is difficult to connect to painted, evaporated or printed conductor by soldering, welding, wire wrap, fusion bonding or other standard means of electrical connection. It is even more difficult when such conductors are disposed on a plastic film which cannot take the heat required for soldering, welding and similar forms of making electrical connections. The difficulty is compounded when there are multiple conductors and multiple layers of conductors.

In making electrical connections, adhesive connectors are well-known to those skilled in the art. For example, the use of conductive epoxy in a conductive adhesive to connect electrical leads to a piezoelectric device is taught, for example, in U.S. Pat. No. 4,785,704, Musical Instrument Transducer, issued Nov. 22, 1988, to Lawrence R. Fishman. See Col. 2, line 41 et seq. In that patent, the conductors are soldered to the connectors. Also, in U.S. Pat. No. 3,325,580, Musical Instrument Using Piezoelectric Transducer, issued June 13, 1967, to L. M. Barcus et al, is taught coating a piezoelectric plate with a conductive paint to provide electrodes. See Col. 6, lines 15 et seq.

Electrical conductors have previously been painted on film substrates. Conductive ink is readily available for painting, or printing of circuits and conductors on plastic films, which films are commonly known and commonly available for use as electrical substrates. The use of electrically conductive paint in making electrical conductors is well-known to those skilled in the art. See, for example, U.S. Pat. No. 3,325,580, for Musical Instrument Utilizing Piezoelectric Transducer, issued June 13, 1967, to L. M. Barcus et al., Col. 6, line 11, et seq.

Conductive inks are readily available. Usually, they are somewhat more viscous than drawing inks and often resemble paints. They are often used to repair broken traces on etched circuit boards. A screen or stencil is often used to print the conductive pattern on a substrate. If used in hybrid microelectronics or on a ceramic substrate, the ink might then be fired in an oven. The conductive property is provided by powdered gold, silver, copper, nickel, or other metals, including alloys of one or more of the above. Sometimes, the ink is applied by pen (with a solvent added to allow freer flow) or even with a syringe having a plunger.

Surface mount technology, (SMT), is a recent development in the art of automated manufacture of electronic equipment. SMT, in general, utilizes small components and usually mounts both the components and conductive traces on the same side of a substrate or surface; however, both sides of a substrate can be used. The electronic packages containing integrated circuits (IC's) in SMT are ordinarily mounted without a socket or receptacle, but such may be used if desired. Most IC packages for surface mount technology have in-line electrical leads. Some are straight, others are gull wing (bent) and still others are turned completely under (termed in the art, "J-leads").

Many electrical components used in SMT are called "lead-less", that is, they do not have electrical leads which extend away from the body of the component, but, rather, have, at each end, an exposed "terminal", or connection area. Nevertheless, the terminals of such electronic devices are "leads" for making electrical connection. The term "lead(s)" in the specification and claims hereof, includes within its meaning "terminal(s)".

The SMT components (whether they have leads or are lead-less) are readily used in the device of the invention. In fact, the invention may be viewed as an improvement in SMT technology, by making it easier to connect to in-line packages and IC packages, having leads, as well as those lead-less components having terminals. The conductive inks and conductive adhesives help to make the desired electrical connections.

Blending adhesives with powdered conductive materials such as, gold, silver, copper, nickel or other metals or alloys, provide excellent conductive adhesives. Such conductive adhesives are readily available on the market. They fall generally into two classes. One class is the thermosetting kind (preferred for permanence) of which the epoxys, acrylics, and polyesters are examples. The other class is the thermoplastic kind (which soften when heated) composed of synthetic or natural polymer, (such as, polyimide siloxane, nylon, neoprene, or rubber) in a solvent or other suitable carrier.

For information pertaining to conductive inks, conductive adhesive inks, adhesives and surface mount technology, in general, refer to Radio-Electronics, page 59 et seq., November, 1987, "Introduction to SMT", by Forrest M. Mims, III.

The problem which remains is that of connecting thin, flat film conductors, (particularly those that are formed by depositing conductive inks or paints on a thin, plastic film), to in-line and other electronic packages. Soldering or welding to conductors which are "painted" films are usually difficult and often unsatisfactory. So, also, the plastic films cannot withstand the high temperatures which are involved in soldering and welding. Enabling the use of plastic film substrates opens up a whole panorama of capabilities in the manufacturing process.

SUMMARY OF THE INVENTION

This invention solves the problem of making electrical connection to "painted", or "inked", conductors on plastic films and provides a reliable, economic method of connecting conductors to in-line and other electronic packages. It also provides a simple, economical method of manufacturing a connector for connecting to the leads, or pins, of an electronic package and, also, provides input and output conductors electrically connected to such leads. This invention also includes the manufactured device.

The device of the invention, in preferred embodiments, holds the electrical conductors (which form the connector) in physical and electrical contact with the leads, or pins, of an electronic package by resilience, adhesive, or both. Other methods (for example, spraying or painting with an acrylic, dielectric compound or potting in a dielectric compound) may be used to assure the physical (structural) and electrical integrity of such electrical connections.

The device of the invention is easily manufactured and easily connected to the leads, or pins, of one or more single in-line packages, dual in-line (DIP) packages, flatpacks, quadpacks, chip carrier or other electronic package having a plurality of electrical leads. A preferred embodiment utilizes a column of electrical conductors, each conductor of which connects to a respective lead of the in-line package. A row of conductors are disposed so that each conductor of the row may be connected to one or more of the conductors in the column of conductors. Thus, one can connect any desired pin to any selected input or output.

Further, miniature, electrical components, such as capacitors, resistors and the like, may be electrically connected to or between desired conductors. Such miniature electrical components may be either disposed on or generated on, or in, the film. Such electrical components, in their simplest form, include only terminals at their ends (for electrical connection). Other components have electrical leads or pins which extend from the body of the components.

Consequently, the device of the invention may be substituted for printed circuit boards or complete electrical systems or subsystems. Inasmuch as the invention is capable of holding and electrically connecting to in-line packages and other electrical components, the invention provides an economical substitute for printed circuit boards and their accompanying conductors, connectors and sockets. The method of manufacture also provides an economical, reliable method for the manufacture of electrical equipment.

It is, therefore, an object of this invention to provide a method of manufacture of an electrical circuit system.

It is another object of this invention to provide an electrical circuit system.

Another object of this invention is to provide a method of manufacture of an electrical circuit system in which the conductors and connectors are generated on a flexible film.

It is another object of this invention to provide a connector for electrically connecting to one or both sides of an in-line package.

A further object of this invention is to provide conductors which are adapted to be the connector for an in-line package.

Another object of this invention is to provide means for attaching an electrical connector to an in-line package.

Another object of this invention is to provide a plurality of electrical conductors in a column connected to an in-line electronic package and a plurality of electrical conductors in a row and means for connecting a selected conductor to one or more selected conductors in the column or row, or both, to provide a desired input or output to the leads of the in-line package.

Still another object of this invention is to provide means for connecting the input or output of the system to an edge connector or other interface connector for connection to a circuit board or other electrical system.

A further object of this invention is to provide a means of physically and electrically connecting electrical components to an electrical system.

A still further object of this invention is to provide a matrix for connecting selected columns of electrical conductors for connection with selected rows of electrical conductors.

A final object of this invention is to provide an electrical circuit system to replace printed circuit boards, conductors, connectors and sockets.

BRIEF DESCRIPTION OF THE DRAWINGS

FIG. 3 is another end view of the connector assembly and a DIP showing the film holder disposed on top of the DIP and having a spreader inserted in the film holder holding the conductors on the film in positive engagement with the leads of the DIP.

FIG. 4 is a side view of a DIP and the connector assembly after the film is folded over so as to be able to encompass the DIP and engage its leads but prior to the DIP and its leads being moved into engagement with the film and its conductors. The film holder and its spreader, disposed between the folded halves of the film, are illustrated by hidden lines.

FIG. 5 is the same view as FIG. 4 after the DIP is moved into engagement with the film and its conductors, and showing the film's numerous conductors held in engagement with the leads of the DIP.

FIG. 7 shows another style of layout of conductors on a film, in a column and a row of conductors to provide selectable connections to input and output conductors, which are shown terminating in an edge connector similar to those used on circuit boards.

FIG. 8 is an enlarged view of the conductors and the connector pads at the conductor crossovers. Also shown are miniature electrical components and typical electrical equivalent symbols connected across such pads.

FIG. 9 is an alternate layout of conductors to permit selectable interconnection of conductors.

FIG. 10 illustrates three miniature electrical components and typical electrical equivalent symbols.

FIG. 11 shows a strip of miniature electrical components.

DESCRIPTION

Although the following discussion may refer to connecting to dual in-line packages (DIPS), it is to be realized that connection to single in-line packages, flatpacks, quadpacks and other electronic packages may be accomplished utilizing features of this invention.

Figure 1:
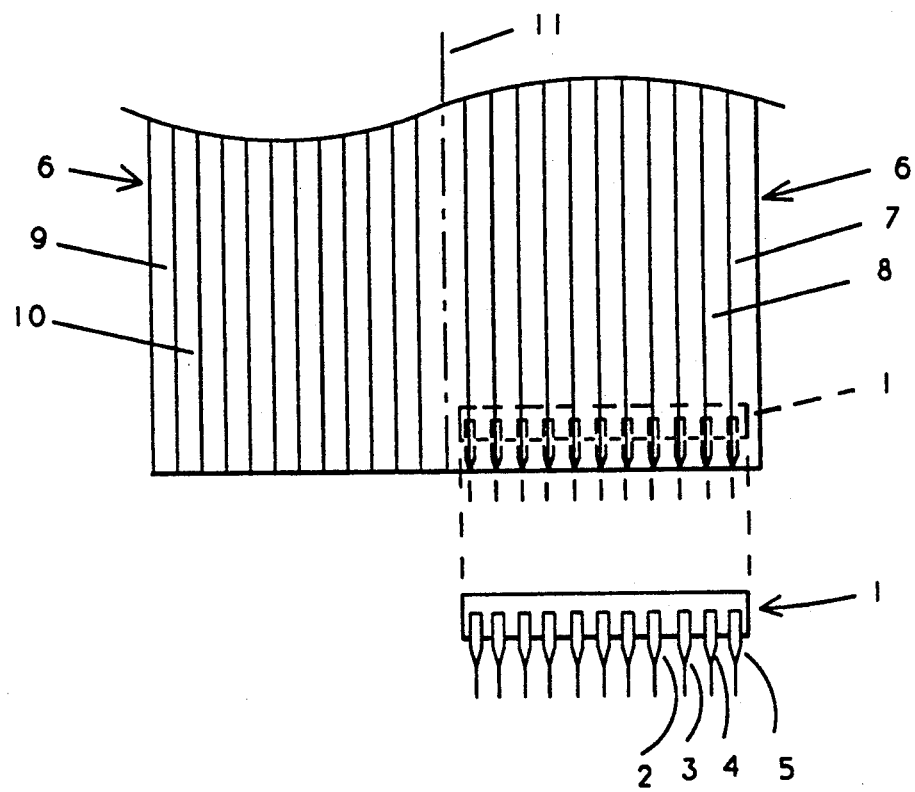
FIG. 1 is a side view of a DIP (having electronic microcircuits, or integrated circuits, therein) showing its leads, together with a view of the end of an associated flexible film, showing the conductors thereon adapted to provide a connector for connecting to the leads of the DIP.

In FIG. 1 is shown a DIP 1 (containing various miniature or microminiature microcircuits or other electronic components) and its leads, or pins, such as 2, 3, 4 and 5 together with associated flexible film 6, showing the conductors, such as 7, 8, 9 and 10 thereon adapted to provide a connector for connecting to the leads, or pins, of the DIP. In the embodiment shown in FIG. 1, the film would be folded along line 11 in order to encompass DIP 1 and thereby contact the leads on both sides of DIP 1. A cut along line 11 for a short distance would facilitate folding the film.

Note that conductors 7, 8, 9 and 10 are on the near side of film 6. Therefore, when film 6 is disposed to encompass DIP 1, conductors 7 and 8 would lie against the two end leads, or pins, on the far side of DIP 1 (opposite pins 5 and 4) and conductors 9 and 10 would lie against pins 5 and 4, respectively. This will become clearer in connection with the subsequent discussion of the drawings.

Note also that the center-to-center distance between conductors on film 6 is the same as the center-to-center distance between the leads, or pins, on DIP 1 in order that each conductor will be in general registration with a respective lead, or pin, when the film is encompassing and making electrical contact with the DIP.

In FIG. 1, dotted lines show the location of DIP 1 when it is moved into position so that leads, or pins, on one side of the DIP come into contact and thus make electrical connection with the conductors of one half of the film.

Figure 2:
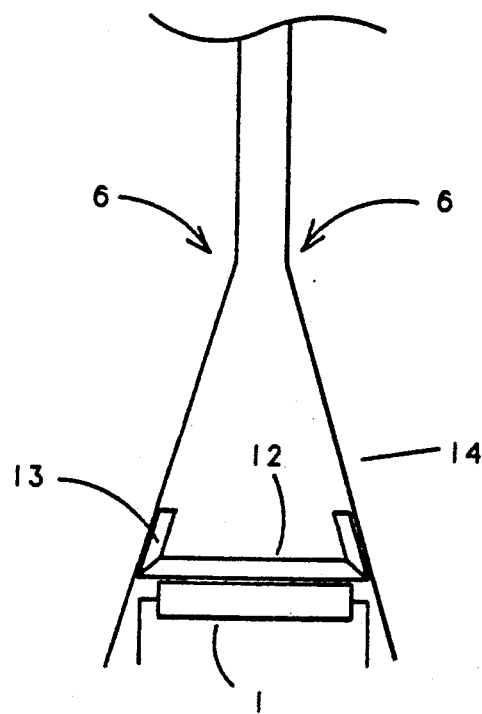
FIG. 2 is an end view of the DIP and the connector assembly, showing a film holder disposed on top of the DIP and the held film which has conductors thereon to be held in engagement with the leads of the DIP. The conductors have not yet been finally engaged with the leads.

FIG. 2 is an end view of the film and package shown in FIG. 1, after film 6 has been folded over to contact both sides of DIP 1. FIG. 2 also shows a film holder 12 on top of the DIP 1. Film holder 12 has two hinges 13 and 14 (of approximately the same length as the DIP) which are attached to the film.

Film holder 12 is preferably attached by an adhesive to DIP 1 and to film 6. However, it may be seen that DIP 1 may be held in place by the resilience of the film in certain circumstances. A simple clip or clamp may also hold the DIP and film holder 12 together. Various combinations of resilience, clamps, clips, or adhesive may be used in holding the film 6, film holder 12, and DIP 1 in position with respect to each other.

FIG. 3 shows a spreader 15 inserted on top of the film holder 12 and forcing the hinges 13 and 14 (and the two portions of film 6 attached to them) outwardly, forcing the conductors on surface of film 6 into physical engagement and, thus, electrical contact, with the pins of DIP 1. Connector assembly 16 thus electrically connects the conductors on film 6 to the leads, or pins, of the DIP 1. Spreader 15 may be replaced by a small spring.

It should be appreciated that the positions of film holder 12 and DIP 1, in FIG. 3, could be inverted. That is, the DIP 1 would have its leads, or pins, directed upwardly. The DIP 1 would be on top of film holder 12 whose hinges would be directed downwardly and outwardly. The exposed areas of the conductors on the film would have to be suitably located so as to be in registration and contact with the pins of the DIP.

FIG. 4 is a side view of DIP 1, showing, above it, the connector assembly 16 after the film 6 is folded over so as to be able to encompass the DIP 1 and engage its pins but prior to the DIP being moved into engagement with the film and its conductors. The film holder 12 and its spreader 15, disposed between the folded halves of the film, are illustrated by hidden lines. The film holder awaits the moving of DIP 1 into connection position.

In FIG. 4, conductors 9 and 10 are shown as dotted lines because they are on the far side of the near half of film 6. They contact pins 5 and 4, respectively, of DIP 1.

FIG. 5 shows the DIP 1 (hidden) moved into engagement with the connector assembly 16 in which the conductors (such as 9 and 10) of the film are in electrical contact with the pins (such as 5 and 4) of the DIP. DIP 1 is preferably adhesively attached to the film holder 12 but in some embodiments may be held in place by the resilience of film 6 or by clips, clamps, springs or other suitable means.

It is noted that the electrical leads on DIP 1 may be quite short. In fact, the electrical leads (running from inside the DIP case to the outside) may be simply electrical contact points at their outer end. The conductors (such as 9 and 10) on the film will still, nevertheless, provide ready electrical contact to such contact points. Such electrical contact points are, in this specification and the claims hereof included within the meaning of "leads".

Thus, it may be seen that the film and its conductors form and extremely simplified connector for electrically connecting to the DIP.

Figure 6:
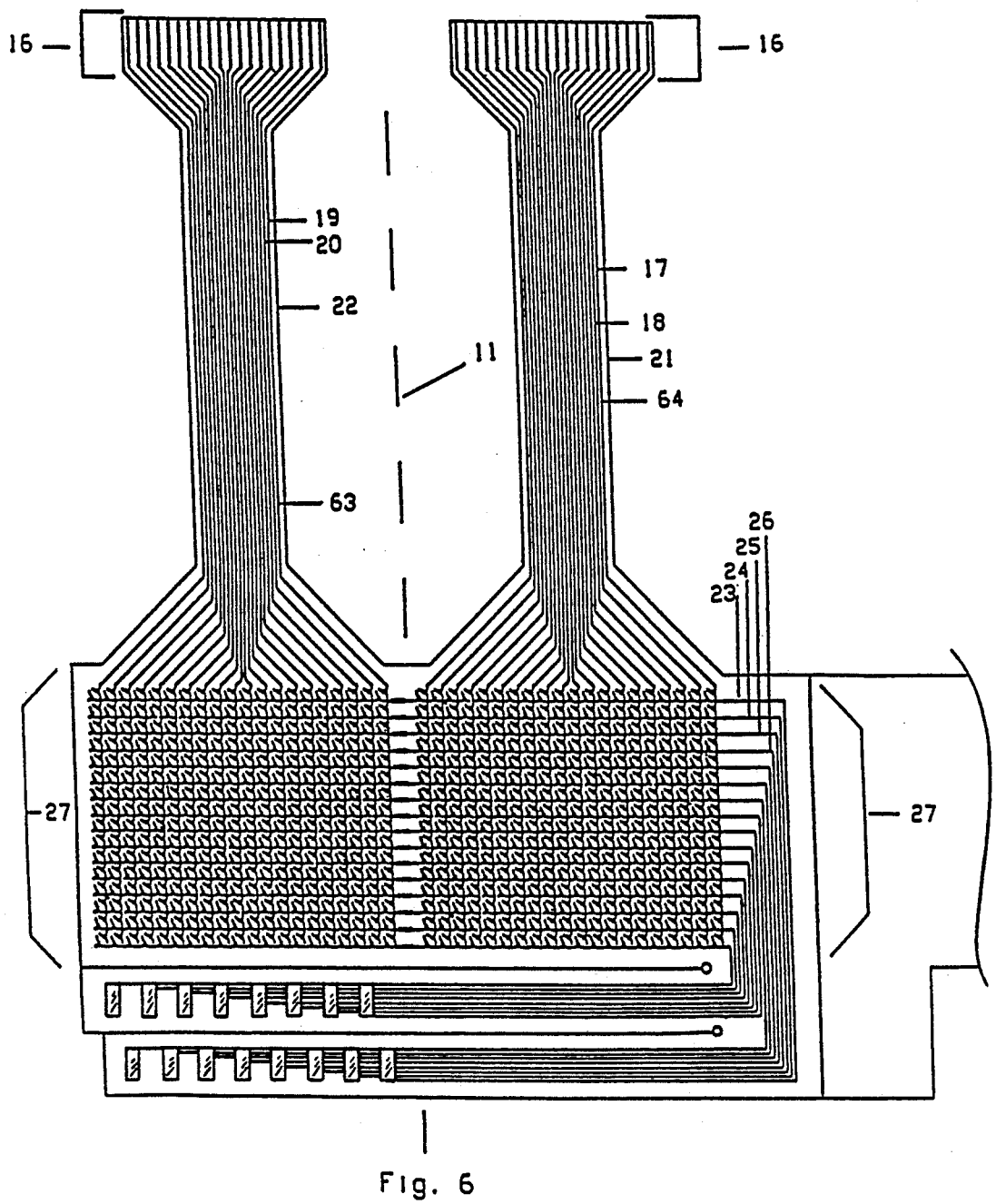
FIG. 6 shows a layout of conductors on a film, to not only form the connector for connecting to DIPs (not shown) but also forming a matrix, comprised of a row of conductors and two columns of conductors (dielectrically insulated from the row of conductors) and means for interconnecting them as desired, to provide a desired input or output to or from any of the leads, or pins, of an in-line package.

FIG. 6 shows the layout on a film 6 of a comprehensive electrical circuit system which comprises a connector assembly portion 16 (for connecting to a DIP), and a plurality of electrical conductors which themselves provide an interconnection matrix.

The connector assembly is comprised of conductors whose ends are electrically exposed. That is, they are not covered by a dielectric so that they may be brought into contact with a DIP and make electrical contact with its leads, or pins. In this embodiment, film holder 12 of FIGS. 2 and 3 may be used to hold the film 6 and a DIP in place and in electrical contact with the conductors on the film. The leads, or pins, of the DIP may extend either upwardly or downwardly. Greater structural strength would be obtained if the DIP is oriented so that its leads, or pins, extend upwardly. The DIP may, of course, simply be adhesively attached to the connector. In some cases, the resilience of film 6 can be effectively used to hold the DIP in place or to make electrical connection therewith, or both.

Other structural means such as clamps, clips, sleeves, springs and so forth may be used to hold the exposed conductive areas of the connector against the leads, or pins, of the in-line package.

Also, electrical connection (between the exposed areas and the leads, or pins, of the in-line package) may be accomplished or enhanced, certain cases, by heat fusion, soldering, welding, fusion bonding, ultrasonic bonding or other method of making electrical connections, as desired. However, the elevated temperatures of such methods, unless closely controlled, would likely be a problem if used in connection with the paints and films of the invention. The preferred (and simplest) embodiments include electrical connection made by on or more of the resilience of the film and an adhesive.

An interconnection matrix illustrated in FIG. 6 provides flexibility in connecting inputs and outputs to the leads, or pins, of a DIP. For example, the first plurality of conductors (such as conductors 17 and 18) form column 21 and the second plurality of conductors (such as conductors 19 and 20) form another column 22 and conductors (such as at 23, 24, 25, and 26) form a horizontal row 27. It is to be noted that the conductors of each column extend down into the matrix where the vertical conductors of the two columns 21 and 22 cross with the horizontal conductors of the row 27.

Inasmuch as the columns of electrical conductors and the row of electrical conductors cross each other, they must be on different levels One level (say, the row) overlays the other (say, the two columns). They must be dielectrically isolated from each other. This may be accomplished by first screening, painting or inking the columns (the vertical columns 21 and 22 of conductors), by using a silver paint, for example, and then covering the silver paint or the entire surface with a dielectric and then screening, painting or inking the row 27 (of horizontal conductors). A final dielectric layer covers and electrically isolates all layers, except for certain areas desired to be left exposed.

It is to be noted that certain areas are to be utilized for electrical connection of components and, therefore, are left exposed. For example, the electrodes of the connector assembly 16, at the top of FIG. 6 would be left exposed (not covered with a dielectric) in order to receive and electrically contact the leads, or pins, of an in-line package or other electronic component. The layers of the system at that location would be, for example, first, the film on the bottom, second, the electrical conductors composed of a silver conductive paint, and third, a dielectric covering except in the exposed areas to contact the leads, or pins, of an in-line package or other electronic component. A graphite coating may be disposed on the exposed contact areas of the conductors. Such coating deters oxidation and other degradation of the exposed conductors and preserve the electrical conductivity of the exposed surface.

The various layers in the area of the matrix formed by the crossovers of the columns 21 and 22 and the row 27 are, for example, first, the film on the bottom, second, the columns (vertical) conductors, third, a dielectric, fourth, the row (horizontal) of conductors, and fifth, a final dielectric.

The device of FIG. 6 is comprehensive in that it allows electrically connecting any vertical conductor to any or all horizontal conductors. Thus, any input or output may be provided to the electronic component in connector assembly 16. Further, any vertical conductor may be connected through a horizontal conductor to another vertical conductor.

In order to provide the connection between vertical conductors and horizontal conductors, there is located at each crossover, two adjacent, connector pads. One connector pad is connected to a vertical conductor and the other is connected to a horizontal conductor. The pads are left exposed (i.e., not covered by the dielectric) in order for them to be connected in circuit with each other. Such connection may be by a simple dash of conductive paint or graphite from one pad to the other, by a conductive, adhesive strip, or button, pressed onto two adjacent pads.

Instead of a simple electrical connection between adjacent connector pads, a miniature electrical component may be attached between the adjacent connector pads. Such electrical component may be most anything, resistor, capacitor, diode, or other electrical device having electrodes. Such electrical components are commonly used in SMT technology and are lead-less, having a terminal at each end of the component body.

Discussion in further detail of the structure allowing electrical interconnection between row and columns will be found hereafter in connection with FIGS. 7 and 8.

The purpose of the matrix in FIG. 6 is to allow any pin of a DIP to be connected through its conductor and an electrical path to any input or output conductor, or to a terminal in an interface device. Such path may be through another electrical component, if desired.

It is to be appreciated that each group of connector leads, or pins, 16 may be connected to a single in-line package, held by suitable adhesive, film holder, clamp or other suitable means. It is also to be appreciated that the structure described in FIG. 6 may be repeated on film 6 so as to permit connections to multiple DIPs or single in-line packages. Furthermore, additional exposed areas may be formed on the conductors, such as at 63 and 64, to interconnect conductors or to connect an additional DIP or to connect single in-line packages.

The row 27 of conductors continues, in FIG. 6, and terminates in a series of exposed conductive pads which may be connected to additional circuitry. The most distal pad connects to the longest conductor which is covered by a dielectric. Then the next pad is created, connected to the second longest conductor, which is then covered by a dielectric. Then the next pad is created, connected to the third longest conductor, etc. So the exposed conductive pads are each connected to only one conductor and are electrically isolated from the others.

FIG. 7 shows another matrix-type arrangement of conductors wherein two vertical columns, 28 and 29 intermesh. A horizontal row 30 of conductors provide a means of interconnection from any conductor in column 28 to any conductor in column 29. Of course, any conductor may be connected to more than one other conductor. Columns 28 and 29 may be on the same level (directly on the film 6 for example). However, the horizontal conductors of row 30 (which may overlay or underlay the vertical conductors) must be dielectrically isolated from both vertical columns 28 and 29.

Of course, the columns and rows may be disposed in layers as desired, utilizing dielectric to isolate the columns and rows as desired.

In FIG. 7, the vertical conductors 29 terminate in an edge connector 31 which provides an interface to other systems or subsystems. The edge connector may be a female edge connector rather than the male edge connector shown. Other interface connection means may be used, including sockets, plugs and receptacles. Instead of the edge connector 31, another connector assembly (such as shown at 16 in FIG. 6) may connect to a second DIP.

FIG. 8 is an enlarged view of the conductors, more clearly illustrating the connector pads, such as 32 and 33, at the conductor crossovers. Such connector pads are left exposed in order that they may be readily connected to each other or a lead-less component may be attached across them and electrically connect them. Such connector pads may be covered with graphite to prevent degradation. Also shown are miniature electrical components and typical electrical equivalent symbols connected across such pads. Connected from connector pad 32 to connector pad 33 is shown an electrical component 34 (without specifying its nature). Such components, whether they be a resistor, a capacitor, a diode, a simple conductive connection or whatever, are readily connected to the exposed conductor pads. A capacitor 35 and resistor 36 are shown, schematically, as typical of many examples. The components may be connected in any suitable manner, including by conductive adhesive. Attaching a component (which, again, may be only a conductor extending from one adjacent pad to the other) may be facilitated by a 3M Scotch Brand transfer tape which is an adhesive film which is vertically, but not horizontally, conductive and lends itself readily to receiving and holding electrical components in electrical contact with the underlying graphite-covered connector pad, without shorting to undesired terminals or conductors. Such transfer tape may be placed over one or many of the conductor pads or any larger area, if desired. Such transfer tape is also suitable for adhering the body of the component (which is usually a dielectric) to the film. For example, transfer tape could cover the entire matrix area 27 of FIG. 6, to allow attaching and (at the same time) electrically connecting components wherever desired. Of course, it is understood that "vertically conductive" means that the tape is conductive through the tape and not along the tape.

Components and conductors could then be adhered to any desired location on the matrix and make the desired electrical connection vertically through the tape and from one conductive pad to another. In this way, electrical circuits and systems can readily be formed on the matrix 27, in conjunction with an in-line electronic package at 16. In addition, or alternatively, such electrical circuits formed on the matrix, could be associated with a flatpack or quadpack as set explained hereafter in connection with FIGS. 12 to 16 and 17 and 18. This provides a very powerful electronic circuit-forming capability.

By "electrical components", applicant means and intends to include the electrical component of a simple, electrical connection from one location to another.

While the conductors such as at 37, 38, 39 and 40, may be scaled larger or smaller they may be of a width of one millimeter (40 mils) where space permits and a thickness of 10 or so micrometers. Where space is at a premium, they may be reduced to half that, or less, in width. The resistance of the conductor increases, of course, when it is narrowed. The conductor pads such as at 32 and 33 may be scaled in size so as to be convenient to work with in attaching conductors and components. I have found connector pads which are 2 millimeters on a side are convenient to work with. A spacing of 0.5 millimeters between connector pads is sufficient and allows high density packing of components and conductors. Miniature components 3 millimeters in length readily fit such structure.

It should be recalled that horizontal lines such as 37 and 38 are dielectrically isolated from vertical lines such as 39 and 40. It is also pointed out that connection from one connector pad to another may be simply a conductor comprising a conductive paint, a graphite ink, a conductive tab or other conductive substance or means.

FIG. 9 is an alternate layout of conductors permitting selectable interconnection of conductors. It does not provide for the wide variability of connecting different conductors together, as do the embodiments of FIGS. 7 and 8, nevertheless it provides a capability of interconnecting several conductors with several others. Conductive tabs or electrical components, such as shown by dotted lines at 41 and 42 may of course, be connected to make an electrical circuit between conductors 43 and 44.

FIG. 10 illustrates three miniature electrical components and typical electrical equivalent symbols. Component 45 is shown as being a capacitor, component 46, a resistor and 47, a diode.

When such components are in place and electrically connected, they may, of course, be potted in, say, an epoxy compound for greater physical strength and rigidity. So, too, with the electronic packages after they are electrically connected to the flexible conductors.

FIG. 11 shows a strip of miniature electrical components. Miniature electrical components of various kinds are available from manufacturers in strips such as is shown. Electrical connection is made to a conductive portion at each end of the component. Thus, they are readily attached by simply affixing them to the connector pads as described in connection with FIG. 8.

Figure 12:
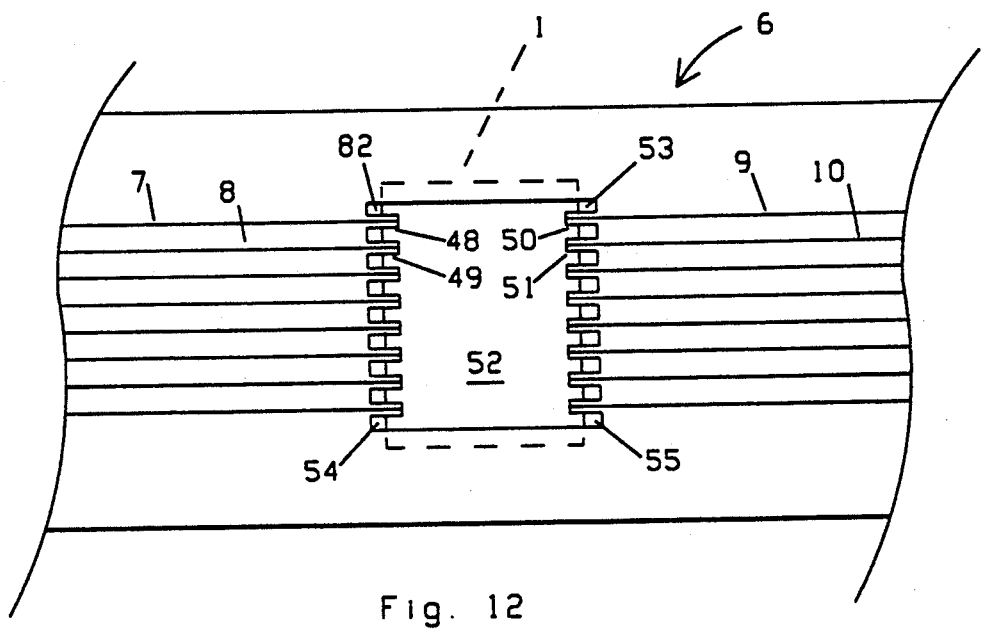
FIG. 12 is a top view of an alternate layout of conductors on a film to form a connector comprised of fingerlike extensions for connecting to an in-line package.

FIG. 12 is a top view of an alternate layout of conductors on a film to form an alternative connector comprised of fingers for connecting to an in-line package. The conductors, such as 7, 8, 9 and 10 on the film 6, terminate on fingerlike extensions such as at 48, 49, 50 and 51, which extend into open space 52. The fingerlike extensions are resilient. The dotted lines show where DIP 1 would be located.

It is desirable that the conductors not break as they are bent to receive an electronic package. Therefore, in the manufacturing process, the conductor may be thicker or composed of a greater concentration of metallic powder at the location of the fingerlike extensions. However, the 7 mil film used by applicant, and the 1 mil thick conductor (twice screened to be obtained) is suitable.

It is to be appreciated that the fingerlike extensions, such as shown at 48, 49, 50 and 51 need not necessarily have gaps between them, but may only have slits separating them. In a particular embodiment, with film of suitable flexibility, the portions extending into the open space 52 are not slit or separated at all, except as necessary to allow the portions to bend when the DIP is inserted. This may be accomplished by simple cuts at such locations as 82, 53, 54 and 55, instead of the gaps shown. It is to be appreciated that a single fingerlike extension, such as 48, may carry one, two or more conductors. Such plurality of conductors may connect to a single lead on the package 1 or, if the conductors are properly spaced, to multiple leads on the package.

Figure 13:
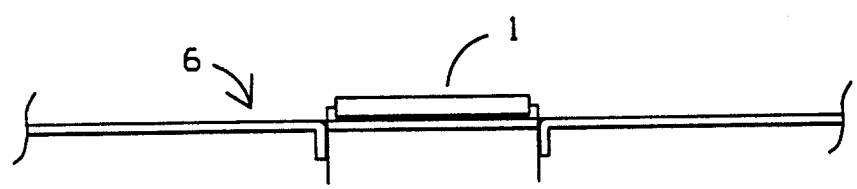
FIG. 13 is an end view of the DIP (and side view of the film) when the DIP is inserted in the connector shown in FIG. 12.

FIG. 13 is an end view of DIP 1 inserted in the connector shown in FIG. 12. It may be seen how the resilience of the fingers of film 6 would readily hold the DIP. Nevertheless, the electrical and structural integrity may be assured by an adhesive, or clips, clamps, welding, soldering, or by using other means to secure electrical connection between the conductors on film 6 and the leads, or pins, of package 1.

Figure 14:
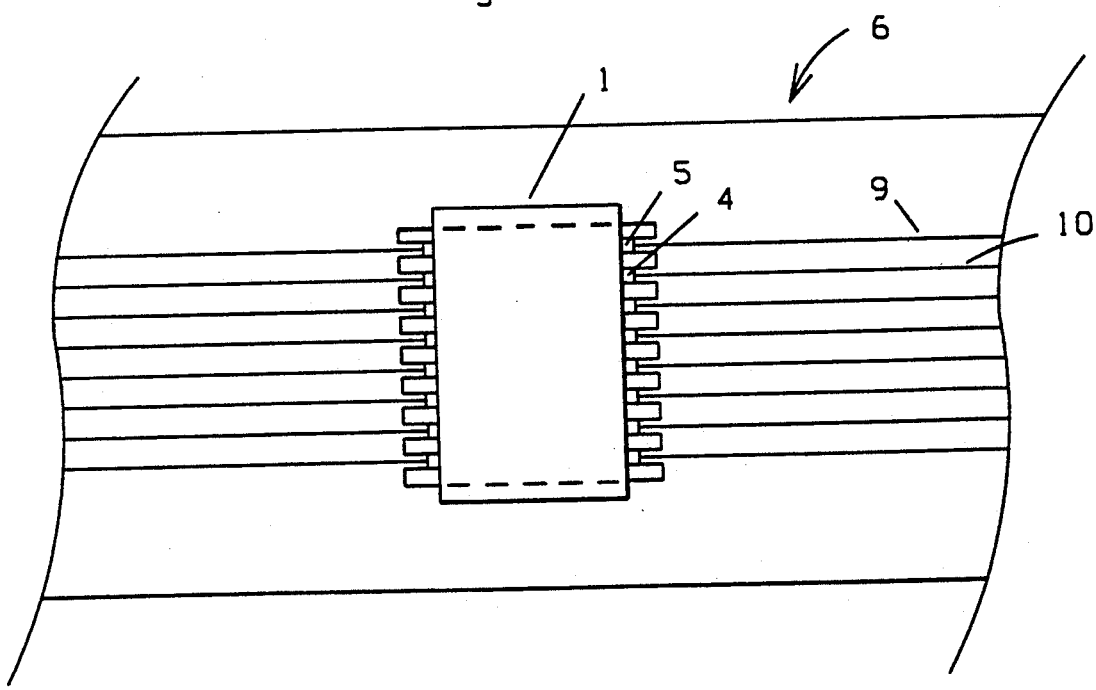
FIG. 14 is a top view showing a DIP inserted into the connector and the conductors (on each finger) making contact with the leads, or pins, of the in-line package.

FIG. 14 is a top view showing a DIP 1 inserted into the connector formed in film 6 whose conductors, such as at 9 and 10, make contact with the leads, or pins, such as at 5 and 4, of the DIP 1.

Figure 15:
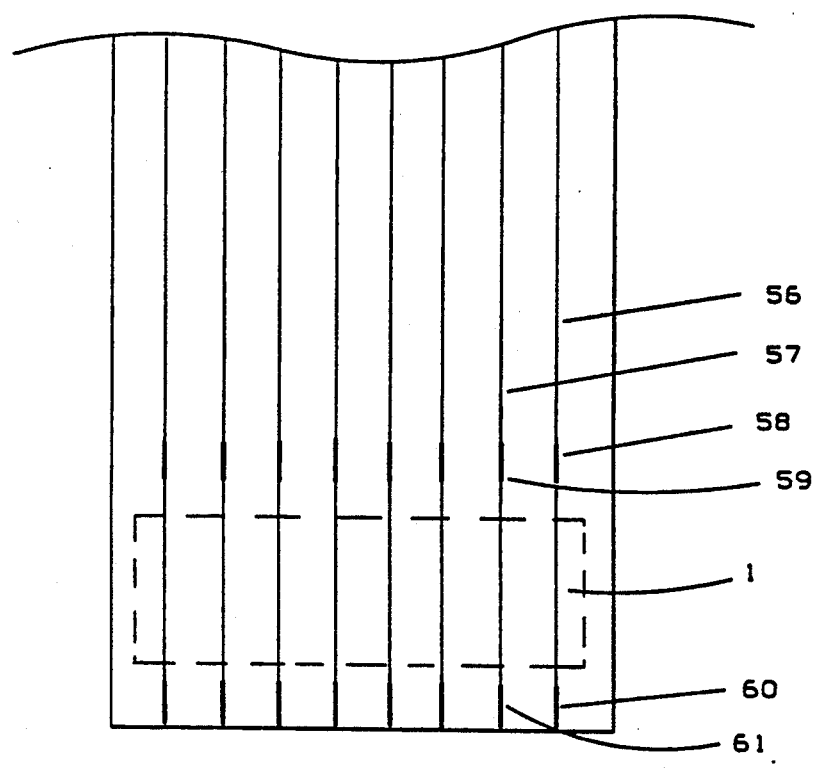
FIGS. 15 and 16 illustrate another method of connecting the film and conductors to a DIP.

FIG. 15 illustrates another means of making a connector of the film and its conductors. Each conductor, such as those shown at 56 and 57, have two exposed areas, such as 58 and 59, 60 and 61, respectively. The DIP 1 shown by dotted lines in FIG. 15 is shown at its approximate location relative to the conductors, when it is ultimately connected thereto. Such conductors actually encompass and hold DIP 1 in the manner shown in FIG. 16.

Figure 16:
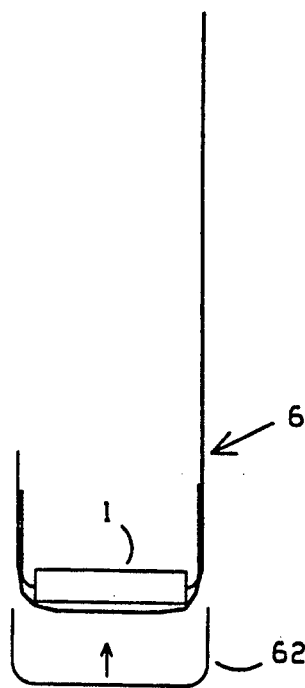

In FIG. 16, DIP 1 is shown in inverted position, (with its leads, or pins, extending upwardly), with film 6 extending from one side to the other of DIP 1, thereby placing the exposed areas of film 6 in electrical contact with the leads, or pins, on both sides of DIP 1. Adhesive may be used to hold such film and leads, or pins, in electrical contact as may also a sleeve such as shown at 62, or other suitable means. Sleeve 62 would slide over the bent film and hold it tight against the DIP 1. Such sleeve may be made of plastic, metal or other material. If electromagnetic isolation is required the metal sleeve might be a ferrous material, otherwise, a non-magnetic material might be used.

Figure 17:
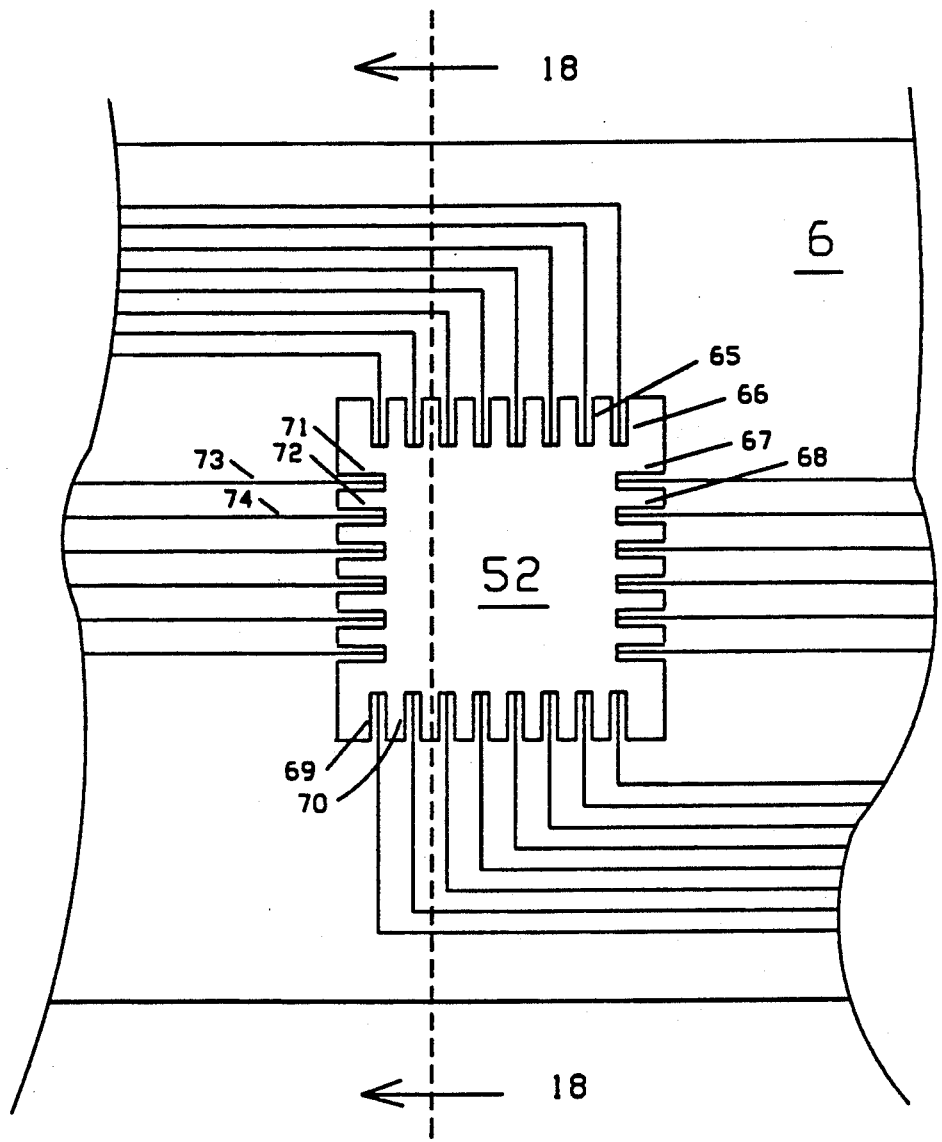
FIGS. 17 and 18 illustrate connecting a flexible film and conductors to a four-sided electronic package, having electrical, gull-wing type leads on all four sides.

FIG. 17 illustrates the flexible film 6 adapted to receive a rectangular or a square electronic package, having electrical leads, or pins, on all four sides. These four-sided electronic packages are often called quad-packs or flatpacks and are especially suited for VLSI (very large scale integration) chips having many input and output connections. As microcircuit chips (integrated circuits) become more and more dense in electronic components, the number of input and output leads, or pins, to the microcircuit package increases and it becomes desirable to have leads on all four sides of the package. The leads on each side of the electronic package may be flat, may be in-line pins, may be gull-wing shape (bent), may be J-shaped, or may be another shape. The device of the invention is adapted to receive and connect to all such leads.

Fingers, or flexible extensions, of the film 6, such as shown at 65 and 66 on the top, 67 and 68 on the right, 69 and 70 on the bottom and 71 and 72 on the left, all have exposed electrical conductors thereon, such as 73 and 74 on extensions 71 and 72. The fingers (or electrical extensions) extend into an open space 52 within film 6, and when the electronic package is pressed into place, the fingers bend and place the electrical conductors in electrical connection with the leads, or pins, of the electronic package.

Figure 18:
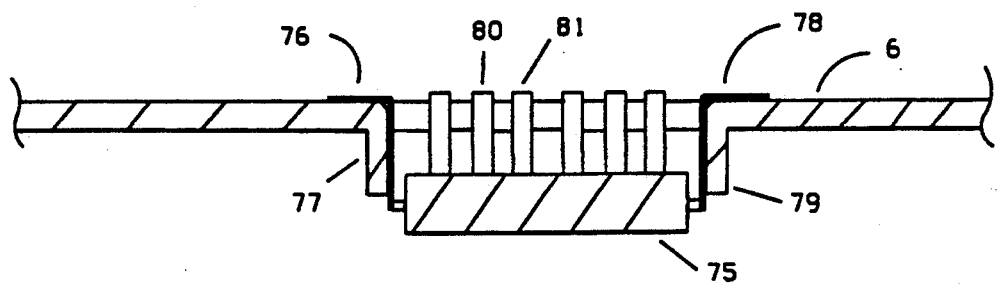

FIG. 18, is a cross-section taken on line 18 of FIG. 17, with a microcircuit package 75 having been inserted. Some of the leads on three sides of the package are shown, illustrating how they connect to the film and the conductors 6 thereon. It is noted that the leads from the microcircuit package 75 are bent (termed "gull-wing" leads, in the art). Lead 76 illustrates the leads, on a first side of the flatpack, connecting to the bent, fingerlike extension, 77 of the film 6 and thereby being electrically connected to the conductor carried by such extension 77. Likewise, lead 78 illustrates the leads, on a second side of the flatpack, connecting to the bent, fingerlike extension, 79 of the film 6 and thereby being electrically connected to the conductor carried by extension 79. Leads B0 and B1 illustrate the leads on a third side of the flatpack, connecting to the conductors on the film 6. It is noted that the bent portion of the leads bear against the film 6 and further increase the electrically-conductive area between leads and conductors. However, it is not necessary that such leads on the electronic packages be bent at all. Electrical contact will still be made by the conductors on the flexible fingers.

As can be seen from FIG. 18, electrical connections, between the electronic package 75 and the conductors on film 6, may be accomplished without any of the flexible extensions such as are shown at 77 and 79. The gull-wing (bent) leads, such as those shown at 76, 78, 80 and 81, bear on their respective conductors on film 6 and may be held attached, structurally and electrically, to such conductors by a conductive adhesive.

As explained previously, in connection with FIG. 5, the leads on the electronic package 1, may be very short. They may run from inside the package and, at their outer, exposed end, appear to be simply an electrical contact. The flexible fingers of FIGS. 6, and 12 through 18 would, nevertheless, provide effective electrical contact to such electrical contacts. The term "lead(s)" in this specification and the claims hereof, include within its meaning such "electrical contact(s)".

The film 6 on which the conductors of the invention are formed is, preferably, a heat-stabilized Mylar coated to accepted conductive paint and dielectric paint. Such Mylar is available from E. I. DuPont de Nemours & Co. (Inc.), Electronic Products Department, Component Materials Division, Wilmington, Delaware, 19898.

Adhesives are available on film or separately from the above Industrial Specialties Division, 3M, 3M Center, St. Paul, MN 55144. There are rubber adhesives, acrylic adhesives and other synthetic and natural adhesives available.

An example of a suitable non-conductive adhesive is 3M's 467. Other conductive ink and conductive adhesive manufacturers are mentioned in the above-mentioned article in Radio-Electronics by Forrest Mims III. Epoxy mixed with adhesives may serve as a dielectric adhesive. Epoxy mixed with conductive metal powder may serve as a conductor. Epoxy mixed with conductive metal powder and adhesive may serve as an adhesive conductor.

An example of a suitable conductive adhesive on a film which is only conductive vertically, that is, through and not along, the film, is Scotch Brand transfer tape available from 3M. Such transfer tape is vertically conductive to a resolution of approximately 1 mil. It is believed such film is manufactured by suspending vertical, electrically conductive fibers in a non-conductive film.

The electrical conductors of the invention may be formed on the film in several ways. "Forming" as used herein is intended to cover all means of creating such electrical conductors, including, without limitation, depositing, electroplating, evaporating, drawing (by a plotter or otherwise), inking or painting with a brush, pen or jet, silk screening, printing (in all its various forms and techniques), and all other forms of graphical reproduction. Still other methods of applying conductive materials may be found useful in "forming" electrical conductors and practicing the invention herein described.

"Ink" or "paint" are meant herein to be synonymous and each are intended herein to mean and include the other, as are "printing" and "painting", in this connection. Silk screening (or more accurately, polyester screening) is one method of "inking" or "painting". So, too, "graphical reproduction" is intended to include "printing" and "painting" and all other methods of applying "ink" or "paint" to paper, plastic or other carrier. All such methods are included within the meaning of "graphical reproduction" (whether it be by typography, photography, lithography, plotting, recording, offset printing, silk screening or otherwise).

The conductive ink, or paint, used in making the conductors on film 6, may be any suitable, conductive ink. Applicant has found that an ink comprised of a silver vinyl polymer mixture in which 45-50 percent is silver is suitable.

A specific ink which is suitable in making the conductors is DuPont polymeric thick film conductor composition 5007 which is available from E. I. DuPont de Nemours & Co. (Inc.), Electronic Products Department, Component Materials Division, Wilmington, Delaware, 19898. Another suitable ink is a silver vinyl polymer conductive coating, 725 A (62-54) available from Olin Hunt Specialty Products Inc., 5 Garrett Mountain Plaza, West Paterson, N.J. 07424. Other manufacturers, some of which are mentioned in the article by Forrest Mims III above, provide similar, suitable inks which may be applied to films by painting, printing, plotting, screening or other graphical reproduction methods.

The conductors formed on the film, whether inked, painted, deposited or otherwise constructed, must be capable of flexing with the film and not crack, break or come loose from the film, during manufacture, processing or use.

It has been found desirable to cover the conductive pads, the conductors and other exposed, conductive areas, with graphite ink where further connections are to be made. The graphite prevents oxidation and other degradation of the silver conductors yet allows for ready electrical connection. The connector pads shown in FIG. 6 may be superposed on silver conductors or may be composed entirely of graphite, connected at some point with its respective conductor. Such conductor pads are shown in detail at 32 and 33, in FIG. 8.

Such graphite ink is available from Olin Hunt Specialty Products at the address given above.

Of course, the conductive ink is covered extensively with a dielectric layer. A suitable dielectric composition which may be applied by screening through a polyester screen in a manner similar to that used in applying the conductive ink, or by broad brush application or otherwise, is an ultraviolet-curable, dielectric polymer thick film ink, 26NCP68, available from Olin Hunt at the address given above. It is an acrylate ester. One dielectric which has been found to be well-suited for use is CL-2 available from NOR COT, 506 Lafayette Ave., P.O. Box 668, Crawfordsville, IN, 47933. It is an ultraviolet texture ink and it makes a line dielectric. Such dielectrics are preferably screened on because the conductive pad areas and conductive switch electrode areas must be left exposed. Such dielectric inks are usually cured by infrared or heat. In any event, the manufacturer's specification for curing should be followed.

As with the conductive ink, the dielectric ink must be flexible in order to avoid cracking or breaking during manufacture, processing or use. It must retain its dielectric integrity when the film is flexed.

Inks are screened, printed or painted on the film in accordance with the manufacturer's specifications. Screening is often used in order to achieve the desired resolution of conductor lines. The conductors may be as thin as 12 micrometers, (according to manufacturer's specifications) but are preferably on the order of one mil thick. If screened on, it is desirable to stroke the ink twice to get it sufficiently thick.

Again, the manufacturer's specifications should be followed. The conductors are preferably on the order of 20 mils to 30 mils wide, or as otherwise desired. It has been found that where space is a premium, 20 mils is satisfactory, but where space is available 30 or, even 40 mils is advantageous in that it is less resistive. The conductors are spaced approximately 20 to 30 mils apart.

Stainless steel, Dacron and other polyester screens of from approximately 200 to 350 mesh have been found suitable for printing the conductors, (including where they function as connectors) and connector pads. A polyester screen having a mesh of about 280 is preferred in creating the conductors, connector pads and in screening on the dielectric.

The film, constituting the main body of the invention, is flexible but it may be stiffened by attaching it to a substrate, such as a fiberglass board, ceramic substrate, printed circuit board or other backing. If desired, the flexible film could be held by a frame or other means. Stiffeners, or battens, comprised of rigid metal, plastic or other material could be used.

Although specific embodiments and certain structural arrangements have been illustrated and described herein, it will be clear to those skilled in the art that various other modifications and embodiments may be made incorporating the spirit and scope of the underlying inventive concepts and that the same are not limited to the particular forms herein shown and described except insofar as indicated by the scope of the appended claims.

I claim:

1. The method of manufacture of an electrical circuit system adapted to electrically connect to an electronic package having a plurality of electrical leads disposed on each of at least two opposing surfaces of said electronic package, comprising the steps of forming a first and second plurality of flat, flexible electrical conductors on flat, resilient, flexible film, terminating said conductors at or prior to the end of said film, disposing said first and second plurality of conductors so as to receive an electronic package between them, said film being disposed so that the resilience of said film is adapted to urge said electrical conductors against said plurality of electrical leads on each of said opposing surfaces of said package, when a package is received between said first and second plurality of conductors.

2. The method of claim 1 wherein said conductive material of said electrical conductors is formed on said substrate by graphical reproduction technique.

3. The method of claim 2 wherein said forming by graphical reproduction technique is accomplished by plotter means depositing a conductive ink and said plotter means is controlled by computer means.

4. The method of claim 1 wherein is included the step of at least partially covering said electrical conductors with a dielectric, providing exposed, conductive areas of said conductors, and wherein said film is disposed so that the resilience of said film urges the exposed, conductive areas of said electrical conductors against said plurality of electrical leads on each of said opposing surfaces of said package.

5. The method recited in claim 4 wherein said exposed, conductive areas of said electrical conductors are formed at or near an end of said film.

6. The method recited in claim 1 wherein at one end of said film, one portion of said film is adapted to be disposed face-to-face with another portion of said film, and thus adapted to receive said electronic package between them and forming a connector for said leads on said opposing surfaces of said electronic package.

7. The method recited in claim 1 wherein electrically-conductive adhesive means is disposed between said electrical conductors and said electrical leads of said electronic package.

8. The method recited in claim 1 wherein said electrical conductors are held in electrical contact with said electrical leads, at least in part, by the resilience of said film.

9. The method recited in claim 1 wherein said film, at least at one end thereof, is formed into fingerlike extensions each carrying one or more of said conductors.

10. The method recited in claim 1 wherein said flexible film is adapted to be hinged relative to said package and the resilience of said hinged film, when urged outwardly at the location of hinging, is adapted to urge said electrical conductors against said electrical leads.

11. The method recited in claim 1 wherein is included the step of creating a third plurality of conductors, on said film, crossing said first and second plurality of conductors and dielectrically isolated therefrom, said crossing conductors defining areas bounded on four sides by said conductors and wherein is formed within said bounded areas, adjacent, exposed, conductive pads connected to respective conductors, which adjacent, exposed conductive pads are adapted to receive and electrically connect surface mount electrical components between selected conductors.

12. The method recited in claim 11 in which said surface mount electrical components are connected between selected conductors by vertically-conductive, adhesive means.

13. The method recited in claim 11 in which said third plurality of conductors cross said first and second plurality of conductors in approximately orthogonal relationship and adjacent, conductive pads are disposed within areas bounded by said crossing conductors, said pads being approximately two millimeters or less on a side, and separated by approximately half a millimeter or less, for mounting surface mount components of approximately 3 millimeters or less in length.

14. An electrical circuit system for connecting to an electronic package having a plurality of electrical leads disposed on each of at least two opposing surfaces of said package, said system comprising a flat, resilient, flexible film having a plurality of flat, flexible electrical conductors thereon, said conductors terminating at or prior to the end of said film, said plurality of electrical conductors disposed in at least a first plurality and a second plurality of conductors, said first and second plurality of conductors adapted to receive said electronic package between them, and said film being disposed so that the resilience of said film urges said electrical conductors against said plurality of electrical leads on each of said opposing surfaces of said package.

15. The combination recited in claim 14 wherein said conductors have a dielectric disposed thereover except at or near at least one of the ends of said first and second plurality of conductors, where such conductors are exposed.

16. The combination recited in claim 14, wherein said film at one end thereof comprises fingerlike extensions each carrying one or more of said conductors.

17. The combination recited in claim 14 wherein said electrical conductors are disposed, at or near an end of said film, into said first and second plurality of conductors and said conductors are adapted to receive said electronic package between them, at or near said end of said film.

18. The combination recited in claim 14 wherein at least a portion of said film, at the end thereof, is adapted to be disposed in face-to-face relationship with at least another portion of said film, forming a connector for said opposing surfaces of said electronic package from said flat film and said conductors thereon.

19. The combination recited in claim 14 wherein said electrical conductors are held against said electrical leads, at least in part, by electrically-conductive, adhesive means.

20. The combination recited in claim 14 wherein said plurality of conductors are adapted to be held, at least in part, against said plurality of electrical leads by the resilience of said film.

21. The combination recited in claim 14 wherein said system is adapted to hold in place an electronic package, at least in part, by the resilience of said film pressing said electrical conductors against said electrical leads on opposing surfaces of said electronic package.

22. The combination recited in claim 14 wherein is included said electronic package, and wherein said film, and electrical conductors thereon, are hinged relative to said electronic package and wherein is included means for urging said hinged film in a direction to urge said electrical conductors against said electrical leads of said electronic package, by means of the resilience of said film.

23. The combination recited in claim 14 wherein is included on open space in said film, said open space adapted to receive said electronic package having electrical leads on opposing surfaces thereof, and wherein is included fingerlike extensions extending into said open space from at least two opposing sides of said open space, said fingerlike extensions terminating in said open space and adapted to be resiliently flexed by said electrical leads on said package, when said package is inserted into said open space, said film resiliently urging said electrical conductors against said electrical leads.

24. The combination recited in claim 14 wherein said electronic package is physically held in place, at least in part, by the resilience of said film.

25. The combination recited in claim 23 wherein said plurality of electrical leads are bent and wherein said extensions and said conductors are adapted to conform, at least approximately, to said bent electrical leads when said package is depressed into said open space.

26. The combination recited in claim 14 wherein is included a third plurality of conductors, on said film, crossing said first and second plurality of conductors and dielectrically isolated therefrom, said conductors defining areas bounded on four sides by said conductors and wherein is formed within said bounded areas, adjacent, exposed, conductive pads connected to respective conductors which adjacent, exposed conductive pads are adapted to receive and electrically connect surface mount electrical components between selected conductors.

27. The combination recited in claim 26 wherein said surface mount electrical components are connected to said exposed conductive pads by means of vertically-conductive, adhesive means.

28. The combination recited in claim 14 wherein said electronic package has four sides, comprising two sets of two opposing surfaces and a plurality of electrical leads on each of said four surfaces, and wherein is included a plurality of conductors, on said film, adapted to be resiliently placed in electrical contact with the electrical leads on each surface of said electronic package, and wherein said electronic package is held in place, at least in part, by the resilience of said film pressing said electrical conductors against the electrical leads, on opposing surfaces of said electronic package.

* * * * *

UNITED STATES PATENT AND TRADEMARK OFFICE
CERTIFICATE OF CORRECTION

PATENT NO. : 5,042,971

DATED : August 27, 1991

INVENTOR(S) : Stephen D. Ambrose

It is certified that error appears in the above-identified patent and that said Letters Patent is hereby corrected as shown below:

Column 8, line 12, "on" should be <u>one</u>.

Column 13, line 3, "B0 and B1" should be <u>80 and 81</u>.

Claim 23, line 42, "on" should be <u>an</u>.

Signed and Sealed this

Tenth Day of November, 1992

*Attest:*

DOUGLAS B. COMER

*Attesting Officer*     *Acting Commissioner of Patents and Trademarks*